United States Patent
Jang

(10) Patent No.: US 9,638,754 B2
(45) Date of Patent: May 2, 2017

(54) SEMICONDUCTOR APPARATUS

(71) Applicant: SK hynix Inc., Icheon-si Gyeonggi-do (KR)

(72) Inventor: Soo Young Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 91 days.

(21) Appl. No.: 14/525,333

(22) Filed: Oct. 28, 2014

(65) Prior Publication Data

US 2016/0011263 A1 Jan. 14, 2016

(30) Foreign Application Priority Data

Jul. 8, 2014 (KR) ........................ 10-2014-0085222

(51) Int. Cl.
*G01R 31/3187* (2006.01)
*G01R 31/317* (2006.01)

(52) U.S. Cl.
CPC ... *G01R 31/3187* (2013.01); *G01R 31/31701* (2013.01)

(58) Field of Classification Search
CPC G01R 31/26; G01R 31/2642; G01R 31/2648; G01R 31/2831; G01R 31/31702; G01R 1/0491; G01R 31/265; G01R 31/3012; G01R 31/31851; H01L 2224/50; H01L 2225/06579; H01L 24/50
See application file for complete search history.

(56) References Cited

U.S. PATENT DOCUMENTS

| 5,381,451 A * | 1/1995 | Matsukawa ............. G06F 1/025 327/291 |
| 2004/0064750 A1* | 4/2004 | Conway ............. G01R 19/2516 713/401 |

FOREIGN PATENT DOCUMENTS

| KR | 1020070079110 A | 8/2007 |
| KR | 1020090026652 A | 3/2009 |

* cited by examiner

*Primary Examiner* — Tung X Nguyen
(74) *Attorney, Agent, or Firm* — William Park & Associates LTD.

(57) ABSTRACT

A semiconductor apparatus includes a test entry control block configured to generate a plurality of trigger signals and a reset signal according to a test setting command and addresses; and a test entry signal generation block configured to enable a test entry signal when the plurality of trigger signals are sequentially enabled.

10 Claims, 4 Drawing Sheets

SEMICONDUCTOR APPARATUS

CROSS-REFERENCES TO RELATED APPLICATION

The present application claims priority under 35 U.S.C. §119(a) to Korean application number 10-2014-0085222, filed on Jul. 8, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

Semiconductor apparatuses trend to be designed for miniaturization, high speed operation and multi-functionality.

Semiconductor apparatuses undergo tests, and only the semiconductor apparatuses which have passed the tests are manufactured as products.

As semiconductor apparatuses trend toward miniaturization, high speed operation and multi-functionality, the semiconductor apparatuses should pass increased kinds of tests.

In order to perform increased kinds of tests, stable entry to test modes should be possible.

SUMMARY

In an embodiment, a semiconductor apparatus may include a test entry control block configured to generate a plurality of trigger signals and a reset signal according to a test setting command and addresses. In addition, the semiconductor apparatus may include a test entry signal generation block configured to enable a test entry signal when the plurality of trigger signals are sequentially enabled.

In an embodiment, a semiconductor apparatus may include a test entry control block configured to generate a plurality of trigger signals according to a test setting command and addresses which are successively inputted, and enable a reset signal when another command other than the test setting command is inputted. The semiconductor apparatus may also include a test entry signal generation block configured to sequentially enable a plurality of pre-test entry signals when the plurality of trigger signals are enabled in a predetermined order, and enable a test entry signal when a final pre-test entry signal among the plurality of pre-test entry signals is enabled.

In an embodiment, a semiconductor apparatus may include a test entry control block configured to generate first to third trigger signals in response to a test setting command and a plurality of addresses and a reset signal in response to another command. The semiconductor apparatus may also include a test entry signal generation block initialized in response to the reset signal while the first to third trigger signals are sequentially enabled.

DETAILED DESCRIPTION

Hereinafter, a semiconductor apparatus will be described below with reference to the accompanying drawings through various embodiments.

Figure 1:
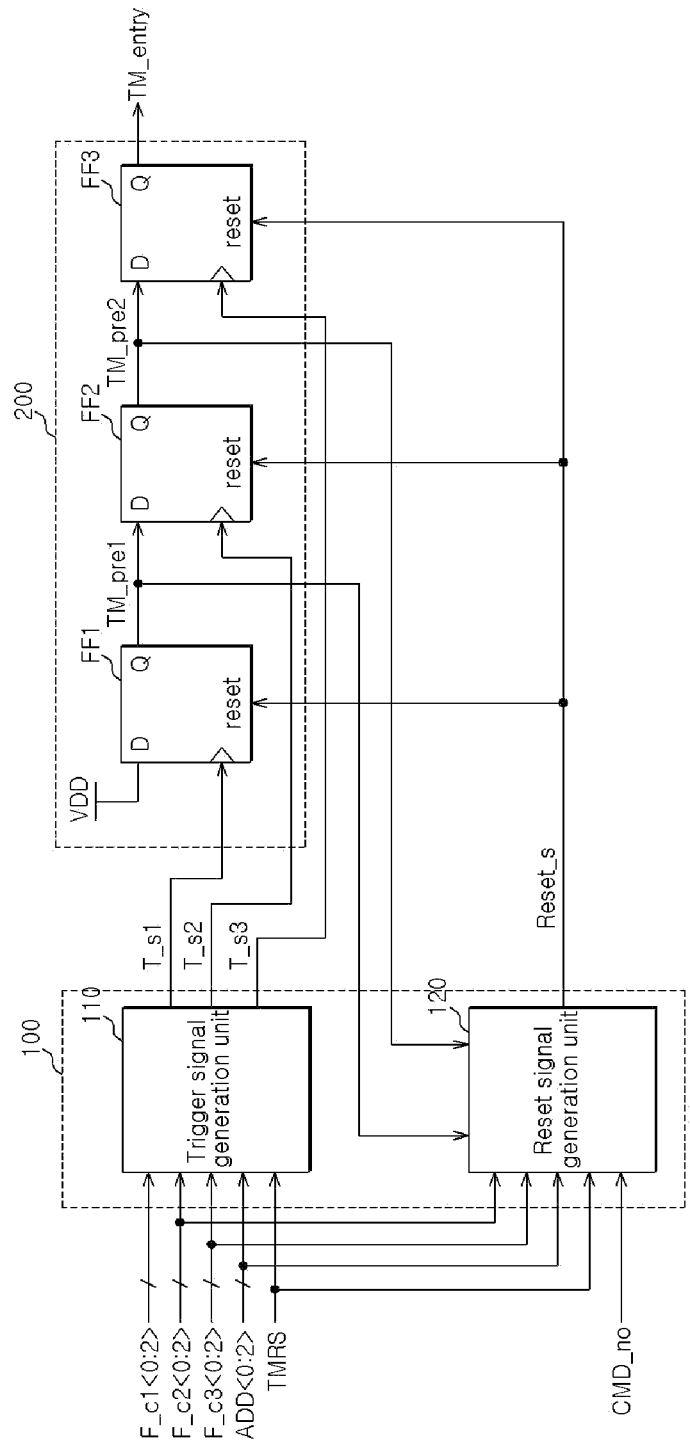
FIG. 1 is a configuration diagram illustrating a representation of an example of a semiconductor apparatus in accordance with an embodiment.

Referring to FIG. 1, a semiconductor apparatus in accordance with an embodiment includes a test entry control block 100, and a test entry signal generation block 200.

The test entry control block 100 generates first to third trigger signals T_s1, T_s2 and T_s3 and a reset signal Reset_s in response to a test setting command TMRS and addresses ADD<0:2>. For example, the test entry control block 100 generates the first to third trigger signals T_s1, T_s2 and T_s3 in response to the test setting command TMRS and the addresses ADD<0:2> successively inputted. In addition, the test entry control block 100 enables the reset signal Reset_s when another command CMD_no except the test setting command TMRS is inputted. More specifically, the test entry control block 100 selectively enables the first to third trigger signals T_s1, T_s2 and T_s3 when the test setting command TMRS and the addresses ADD<0:2> with pluralities of predetermined values (for example, corresponding to first to third fixed codes F_c1<0:2>, F_c2<0:2> and F_c3<0:2>) are inputted. Further, the test entry control block 100 enables the reset signal Reset_s when another command CMD_no except the test setting command TMRS is inputted. In addition, the test entry control block 100 enables the reset signal Reset_s where the addresses ADD<0:2> do not have the predetermined values or, are different from the first to third fixed codes F_c1<0:2>, F_c2<0:2> and F_c3<0:2>, while the test setting command TMRS and the addresses ADD<0:2> are inputted.

The test entry control block 100 includes a trigger signal generation unit 110 and a reset signal generation unit 120.

The trigger signal generation unit 110 sequentially enables the first to third trigger signals T_s1, T_s2 and T_s3 when the addresses ADD<0:2> inputted simultaneously with the test setting command TMRS are the same as the respective first to third fixed codes F_c1<0:2>, F_c2<0:2> and F_c3<0:2>.

The reset signal generation unit 120 enables the reset signal Reset_s when parts (for example, the second and third fixed codes F_c2<0:2> and F_c3<0:2>) among the first to third fixed codes F_c1<0:2>, F_c2<0:2> and F_c3<0:2> are different from the addresses ADD<0:2>. In the alternative, the reset signal generation unit 120 enables the reset signal Reset_s when another command CMD_no except the test setting command TMRS is inputted.

The test entry signal generation block 200 enables a test entry signal TM_entry when the first to third trigger signals T_s1, T_s2 and T_s3 are sequentially enabled. The test entry signal generation block 200 is initialized when the reset signal Reset_s is enabled while the first to third trigger signals T_s1, T_s2 and T_s3 are sequentially enabled.

The test entry signal generation block 200 includes first to third flip-flops FF1, FF2 and FF3.

The first flip-flop FF1 enables a first pre-test entry signal TM_pre1 when the first trigger signal T_s1 is enabled. In addition, the first flip-flop FF1 disables, that is, initializes, the first pre-test entry signal TM_pre1 when the reset signal Reset_s is enabled.

The first flip-flop FF1 is applied with an external voltage VDD through the input terminal. The first flip-flop FF1 is also inputted with the first trigger signal T_s1 through the clock input terminal. In addition, the first flip-flop FF1 is inputted with the reset signal Reset_s through the reset terminal. Further, the first flip-flop FF1 outputs the first pre-test entry signal TM_pre1 through the output terminal.

The second flip-flop FF2 enables a second pre-test entry signal TM_pre2 when the second trigger signal T_s2 is enabled in the state in which the first pre-test entry signal TM_pre1 is enabled. In addition, the second flip-flop FF2 disables, that is, initializes, the second pre-test entry signal TM_pre2 when the reset signal Reset_s is enabled.

The second flip-flop FF2 is inputted with the first pre-test entry signal TM_pre1 through the input terminal. The second flip-flop FF2 is also inputted with the second trigger signal T_s2 through the clock input terminal. Further, the second flip-flop FF2 is inputted with the reset signal Reset_s through the reset terminal, and outputs the second pre-test entry signal TM_pre2 through the output terminal.

The third flip-flop FF3 enables the test entry signal TM_entry when the third trigger signal T_s3 is enabled in the state in which the second pre-test entry signal TM_pre2 is enabled. In addition, the third flip-flop FF3 disables, that is, initializes, the test entry signal TM_entry when the reset signal Reset_s is enabled.

The third flip-flop FF3 is inputted with the second pre-test entry signal TM_pre2 through the input terminal. Further, the third flip-flop FF3 is inputted with the third trigger signal T_s3 through the clock input terminal. In addition, the third flip-flop FF3 is inputted with the reset signal Reset_s through the reset terminal, and outputs the test entry signal TM_entry through the output terminal.

Figure 2:
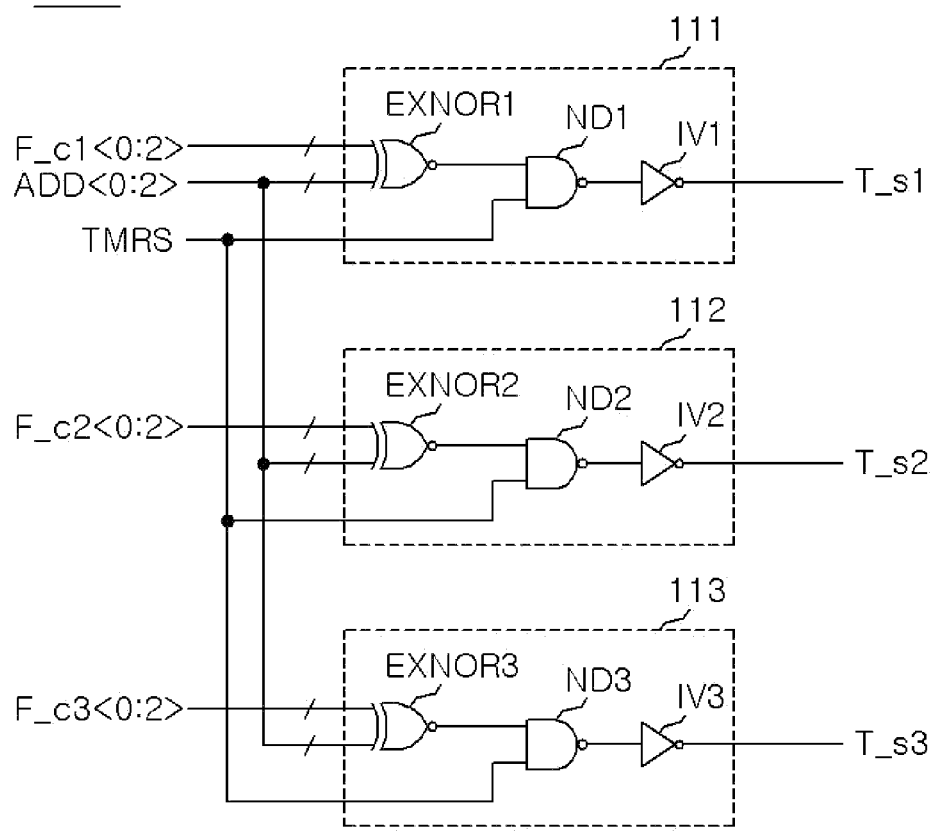
FIG. 2 is a configuration diagram illustrating a representation of an example of the trigger signal generation unit shown in FIG. 1.

Referring to FIG. 2, the trigger signal generation unit 110 includes first to third enable sections 111, 112 and 113.

The first enable section 111 enables the first trigger signal T_s1 when the addresses ADD<0:2> inputted simultaneously with the test setting command TMRS are the same as the first fixed codes F_c1<0:2>.

The first enable section 111 includes a first exclusive NOR gate EXNOR1, a first NAND gate ND1, and a first inverter IV1. The first exclusive NOR gate EXNOR1 is inputted with the first fixed codes F_c1<0:2> and the addresses ADD<0:2>. The first NAND gate ND1 is inputted with the output signal of the first exclusive NOR gate EXNOR1 and the test setting command TMRS. The first inverter IV1 is inputted with the output signal of the first NAND gate ND1 and outputs the first trigger signal T_s1.

The second enable section 112 enables the second trigger signal T_s2 when the addresses ADD<0:2> inputted simultaneously with the test setting command TMRS are the same as the second fixed codes F_c2<0:2>.

The second enable section 112 includes a second exclusive NOR gate EXNOR2, a second NAND gate ND2, and a second inverter IV2. The second exclusive NOR gate EXNOR2 is inputted with the second fixed codes F_c2<0:2> and the addresses ADD<0:2>. The second NAND gate ND2 is inputted with the output signal of the second exclusive NOR gate EXNOR2 and the test setting command TMRS. The second inverter IV2 is inputted with the output signal of the second NAND gate ND2 and outputs the second trigger signal T_s2.

The third enable section 113 enables the third trigger signal T_s3 when the addresses ADD<0:2> inputted simultaneously with the test setting command TMRS are the same as the third fixed codes F_c3<0:2>.

The third enable section 113 includes a third exclusive NOR gate EXNOR3, a third NAND gate ND3, and a third inverter IV3. The third exclusive NOR gate EXNOR3 is inputted with the third fixed codes F_c3<0:2> and the addresses ADD<0:2>. The third NAND gate ND3 is inputted with the output signal of the third exclusive NOR gate EXNOR3 and the test setting command TMRS. The third inverter IV3 is inputted with the output signal of the third NAND gate ND3. The third inverter IV3 also outputs the third trigger signal T_s3.

Figure 3:
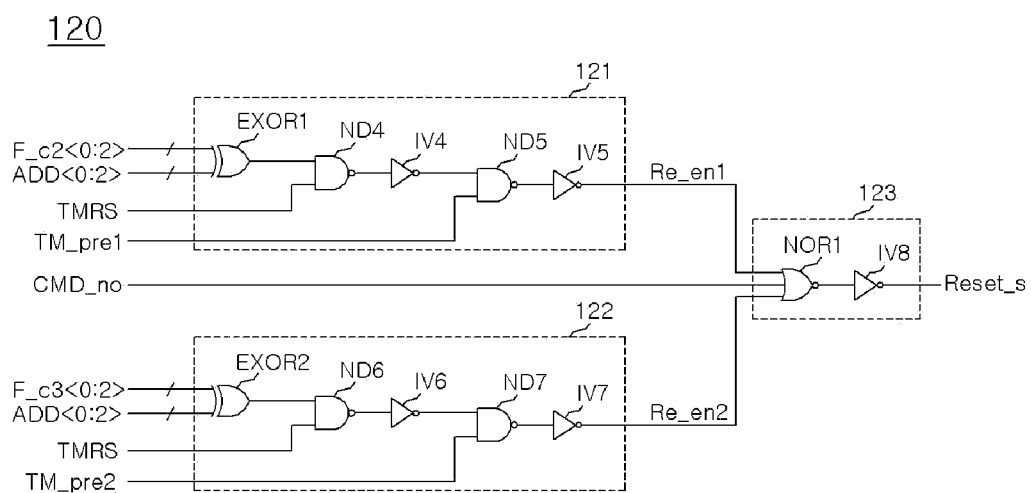
FIG. 3 is a configuration diagram illustrating a representation of an example of the reset signal generation unit shown in FIG. 1.

Referring to FIG. 3, the reset signal generation unit 120 includes first and second reset enable signal generating sections 121 and 122. The reset signal generation unit 120 also includes a reset signal enable section 123.

The first reset enable signal generating section 121 enables a first reset enable signal Re_en1 when the addresses ADD<0:2> inputted simultaneously with the test setting command TMRS are different from the second fixed codes F_c2<0:2> in the state in which the first pre-test entry signal TM_pre1 is enabled.

The first reset enable signal generating section 121 includes a first exclusive OR gate EXOR1, fourth and fifth NAND gates ND4 and ND5, and fourth and fifth inverters IV4 and IV5. The first exclusive OR gate EXOR1 is inputted with the second fixed codes F_c2<0:2> and the addresses ADD<0:2>. The fourth NAND gate ND4 is inputted with the output signal of the first exclusive OR gate EXOR1 and the test setting command TMRS. The fourth inverter IV4 is inputted with the output signal of the fourth NAND gate ND4. The fifth NAND gate ND5 is inputted with the first pre-test entry signal TM_pre1 and the output signal of the fourth inverter IV4. The fifth inverter IV5 is inputted with the output signal of the fifth NAND gate ND5 and outputs the first reset enable signal Re_en1.

The second reset enable signal generating section 122 enables a second reset enable signal Re_en2 when the addresses ADD<0:2> inputted simultaneously with the test setting command TMRS are different from the third fixed codes F_c3<0:2> in the state in which the second pre-test entry signal TM_pre2 is enabled.

The second reset enable signal generating section 122 includes a second exclusive OR gate EXOR2, sixth and seventh NAND gates ND6 and ND7, and sixth and seventh inverters IV6 and IV7. The second exclusive OR gate EXOR2 is inputted with the third fixed codes F_c3<0:2> and the addresses ADD<0:2>. The sixth NAND gate ND6 is inputted with the output signal of the second exclusive OR gate EXOR2 and the test setting command TMRS. The sixth inverter IV6 is inputted with the output signal of the sixth NAND gate ND6. The seventh NAND gate ND7 is inputted with the second pre-test entry signal TM_pre2 and the output signal of the sixth inverter IV6. The seventh inverter IV7 is inputted with the output signal of the seventh NAND gate ND7. The seventh inverter IV7 also outputs the second reset enable signal Re_en2.

The reset signal enable section 123 enables the reset signal Reset_s when any one of the first and second reset enable signals Re_en1 and Re_en2 are enabled. In addition, the reset signal enable section 123 enables the reset signal Reset_s when another command CMD_no except the test setting command TMRS is inputted.

The reset signal enable section 123 includes a first NOR gate NOR1 and an eighth inverter IV8. The first NOR gate NOR1 is inputted with the first and second reset enable signals Re_en1 and Re_en2 and another command CMD_no except the test setting command TMRS. The eighth inverter IV8 is inputted with the output signal of the first NOR gate NOR1. The eighth inverter IV8 also outputs the reset signal Reset_s.

Operations of the semiconductor apparatus in accordance with an embodiment, configured above, will be described below.

While it is described in an embodiment that the test entry signal TM_entry is enabled as the test setting command TMRS and the addresses ADD<0:2> are inputted successively 3 times, it is to be noted that an embodiment of the invention is not limited to such a configuration.

Descriptions will be made for the case where the addresses ADD<0:2> inputted simultaneously with the test setting command TMRS satisfy all predetermined values, or, for the first to third fixed codes F_c1<0:2>, F_c2<0:2> and F_c3<0:2>.

When the addresses ADD<0:2> inputted simultaneously with the test setting command TMRS inputted first are the same as the first fixed codes F_c1<0:2>, the trigger signal generation unit 110 enables the first trigger signal T_s1.

If the first trigger signal T_s1 is enabled, the first flip-flop FF1 enables the first pre-test entry signal TM_pre1.

When the addresses ADD<0:2> inputted simultaneously with the test setting command TMRS inputted second are the same as the second fixed codes F_c2<0:2>, the trigger signal generation unit 110 enables the second trigger signal T_s2.

If the second trigger signal T_s2 is enabled in the state in which the first pre-test entry signal TM_pre1 is enabled, the second flip-flop FF2 enables the second pre-test entry signal TM_pre2.

When the addresses ADD<0:2> inputted simultaneously with the test setting command TMRS inputted third are the same as the third fixed codes F_c3<0:2>, the trigger signal generation unit 110 enables the third trigger signal T_s3.

If the third trigger signal T_s3 is enabled in the state in which the second pre-test entry signal TM_pre2 is enabled, the third flip-flop FF3 enables the test entry signal TM_entry.

Accordingly, the semiconductor apparatus in accordance with an embodiment enables the test entry signal TM_entry when the addresses ADD<0:2> inputted simultaneously with the test setting command TMRS successively inputted 3 times are the same as the first fixed codes F_c1<0:2>, the same as the second fixed codes F_c2<0:2>, and the same as the third fixed codes F_c3<0:2>.

Descriptions will be made for the cases where the semiconductor apparatus in accordance with an embodiment does not enable the test entry signal TM_entry.

Descriptions will be made for the case where, although the addresses ADD<0:2> inputted simultaneously with the test setting command TMRS inputted first are the same as the first fixed codes F_c1<0:2>, the addresses ADD<0:2> inputted simultaneously with the test setting command TMRS inputted second are different from the second fixed codes F_c2<0:2>.

If the addresses ADD<0:2> inputted simultaneously with the test setting command TMRS inputted first are the same as the first fixed codes F_c1<0:2>, the first trigger signal T_s1 is enabled.

If the first trigger signal T_s1 is enabled, the first flip-flop FF1 enables the first pre-test entry signal TM_pre1.

If the addresses ADD<0:2> inputted simultaneously with the test setting command TMRS inputted second are different from the second fixed codes F_c2<0:2>, the reset signal generation unit 120 enables the reset signal Reset_s. Referring again to FIG. 3, if the addresses ADD<0:2> inputted simultaneously with the test setting command TMRS are different from the second fixed codes F_c2<0:2> in the state in which the first pre-test entry signal TM_pre1 is enabled, the first reset enable signal generating section 121 enables the first reset enable signal Re_en1. The reset signal enable section 123 enables the reset signal Reset_s when the first reset enable signal Re_en1 is enabled.

If the reset signal Reset_s is enabled, the test entry signal generation block 200 is initialized. More specifically, if the reset signal Reset_s is enabled, the first to third flip-flops FF1, FF2 and FF3 which configure the test entry signal generation block 200 are all initialized. In addition, the first to third flip-flops FF1, FF2 and FF3 disable the first and second pre-test entry signals TM_pre1 and TM_pre2 and the test entry signal TM_entry. In this instance, the first pre-test entry signal TM_pre1 which has been enabled is disabled.

Descriptions will be made for the case where, although the addresses ADD<0:2> inputted simultaneously with the test setting command TMRS inputted first and second are the same as the first and second fixed codes F_c1<0:2> and F_c2<0:2>, the addresses ADD<0:2> inputted simultaneously with the test setting command TMRS inputted third are different from the third fixed codes F_c3<0:2>.

If the addresses ADD<0:2> inputted simultaneously with the test setting command TMRS inputted first are the same as the first fixed codes F_c1<0:2>, the first trigger signal T_s1 is then enabled.

If the first trigger signal T_s1 is enabled, the first flip-flop FF1 enables the first pre-test entry signal TM_pre1.

If the addresses ADD<0:2> inputted simultaneously with the test setting command TMRS inputted second are the same as the second fixed codes F_c2<0:2>, the second trigger signal T_s2 is then enabled.

If the second trigger signal T_s2 is enabled in the state in which the first pre-test entry signal TM_pre1 is enabled, the second flip-flop FF2 enables the second pre-test entry signal TM_pre2 accordingly.

If the addresses ADD<0:2> inputted simultaneously with the test setting command TMRS inputted third are different from the third fixed codes F_c3<0:2>, the reset signal generation unit 120 enables the reset signal Reset_s. Referring once more to FIG. 3, if the addresses ADD<0:2> inputted simultaneously with the test setting command TMRS are different from the third fixed codes F_c3<0:2> in the state in which the second pre-test entry signal TM_pre2 is enabled, the second reset enable signal generating section 122 enables the second reset enable signal Re_en2. The reset signal enable section 123 enables the reset signal Reset_s when the second reset enable signal Re_en2 is enabled.

If the reset signal Reset_s is enabled, the test entry signal generation block 200 is initialized. More specifically, if the reset signal Reset_s is enabled, the first to third flip-flops FF1, FF2 and FF3 which configure the test entry signal generation block 200 are all initialized. Further, the first to third flip-flops FF1, FF2 and FF3 disable the first and second pre-test entry signals TM_pre1 and TM_pre2 and the test entry signal TM_entry. In this case, the first and second pre-test entry signals TM_pre1 and TM_pre2 which have been enabled are disabled.

Further, the reset signal generation unit 120 enables the reset signal Reset_s when another command CMD_no except the test setting command TMRS is inputted. Accordingly, the reset signal generation unit 120 thereby prevents the test entry signal TM_entry from being enabled.

In this case, the semiconductor apparatus in accordance with an embodiment enables the test entry signal TM_entry only when the addresses ADD<0:2> inputted simultaneously with the test setting command TMRS sequentially satisfy the first to third fixed codes $F\_c1<0:2>$, $F\_c2<0:2>$ and $F\_c3<0:2>$. Furthermore, the semiconductor apparatus initializes the test entry signal generation block 200 when another command CMD_no except the test setting command TMRS is inputted while performing an operation to enable the test entry signal TM_entry. Accordingly, the semiconductor apparatus thereby, prevents the test entry signal TM_entry from being enabled.

Figure 4:
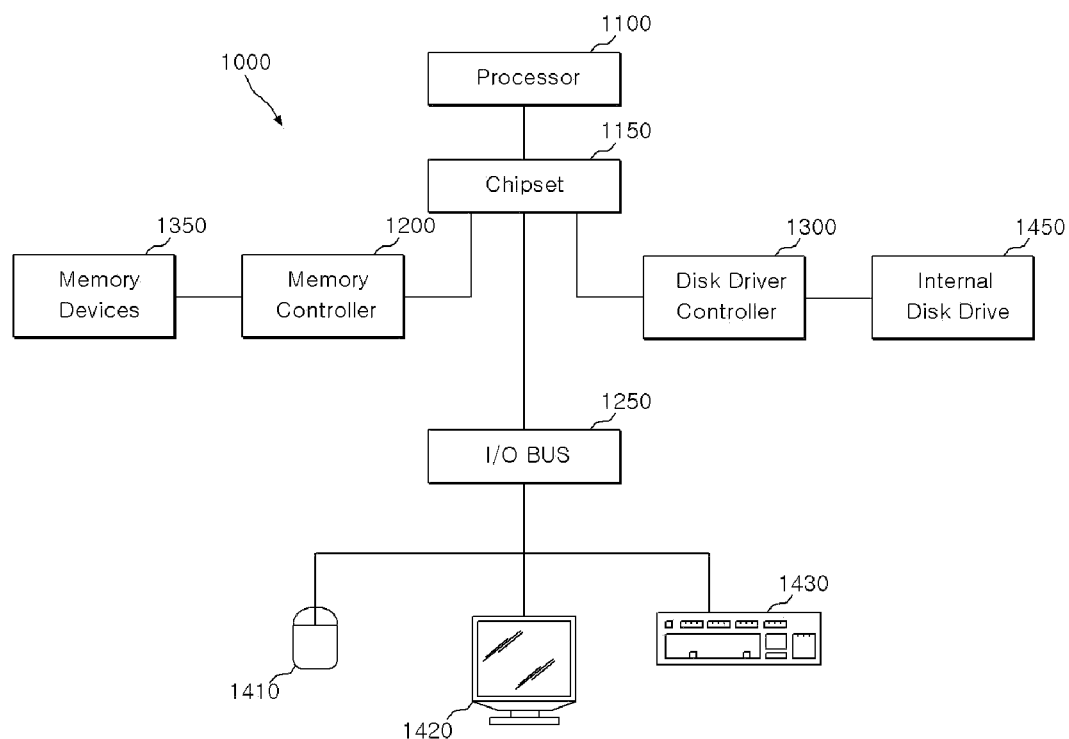
FIG. 4 illustrates a block diagram of a system employing a memory controller circuit in accordance with an embodiment of the invention.

Referring to FIG. 4, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably electrically coupled to the chipset 1150. The disk drive controller 1300 may serve as the communication pathway between the chipset 1150 and or more internal disk drives 1450. The disk drive controller 1300 and the internal disk drives 1450 may communicate with each other or with the chipset 1150 using virtually any type of communication protocol.

As is apparent from the above descriptions, the semiconductor apparatus in accordance with an embodiment may stably enter a test mode.

While various embodiments have been described above, it will be understood to those skilled in the art that the embodiments described are by way of example only. Accordingly, the semiconductor apparatus described should not be limited based on the described embodiments.

What is claimed is:

1. A semiconductor apparatus comprising:
   a test entry control block configured to enable a plurality of trigger signals in a predetermined order in response to a test setting command and addresses successively inputted, and enable a reset signal when another command other than the test setting command is inputted; and
   a test entry signal generation block configured to sequentially enable a plurality of pre-test entry signals when the plurality of trigger signals are enabled in the predetermined order, and enable a test entry signal when a final pre-test entry signal among the plurality of pre-test entry signals is enabled,
   wherein the final pre-test entry signal is enabled when all the plurality of pre-test entry signals are enabled.

2. The semiconductor apparatus according to claim 1, wherein the test entry control block comprises:
   a trigger signal generation unit configured to sequentially enable the plurality of trigger signals when the addresses inputted simultaneously with the test setting command are the same as pluralities of fixed codes; and
   a reset signal generation unit configured to enable the reset signal when a part of the pluralities of fixed codes and the addresses are different from each other, or enable the reset signal when the another command other than the test setting command is inputted.

3. The semiconductor apparatus according to claim 2, wherein the pluralities of fixed codes comprise first to third fixed codes,
   wherein the plurality of trigger signals comprise first to third trigger signals, and
   wherein the trigger signal generation unit comprises:
   a first enable section configured to enable the first trigger signal when the addresses inputted simultaneously with the test setting command are the same as the first fixed codes;
   a second enable section configured to enable the second trigger signal when the addresses inputted simultaneously with the test setting command are the same as the second fixed codes; and
   a third enable section configured to enable the third trigger signal when the addresses inputted simultaneously with the test setting command are the same as the third fixed codes.

4. The semiconductor apparatus according to claim 3, wherein the plurality of pre-test entry signals comprise first and second pre-test entry signals, and
   wherein the reset signal generation unit comprises:
   a first reset enable signal generating section configured to enable a first reset enable signal when the addresses inputted simultaneously with the test setting command are different from the second fixed codes in a state in which the first pre-test entry signal is enabled;
   a second reset enable signal generating section configured to enable a second reset enable signal when the addresses inputted simultaneously with the test setting command are different from the third fixed codes in a state in which the second pre-test entry signal is enabled; and
   a reset signal enable section configured to enable the reset signal when even any one of the first and second reset enable signals is enabled or another command other than the test setting command is inputted.

5. The semiconductor apparatus according to claim 4, wherein the test entry signal generation block enables the first pre-test entry signal when the first trigger signal is enabled, enables the second pre-test entry signal when the second trigger signal is enabled in a state in which the first pre-test entry signal is enabled, and enables the test entry signal when the third trigger signal is enabled in a state in which the second pre-test entry signal is enabled.

6. The semiconductor apparatus according to claim 5, wherein the test entry signal generation block disables the first and second pre-test entry signals and the test entry signal in response to the reset signal.

7. The semiconductor apparatus according to claim 1, wherein the test entry control block selectively enables the plurality of trigger signals when the test setting command and the addresses with pluralities of predetermined values are inputted.

8. The semiconductor apparatus according to claim 7, wherein the test entry control block enables a reset signal when a normal command other than the test setting command is inputted.

9. The semiconductor apparatus according to claim 8, wherein the test entry control block enables the reset signal when the addresses are not the predetermined values while the test setting command and the addresses are inputted.

10. The semiconductor apparatus according to claim 9, wherein the test entry signal generation block is initialized when the reset signal is enabled while the plurality of trigger signals are sequentially enabled.

* * * * *